United States Patent
El Bacha et al.

(10) Patent No.: US 10,718,794 B2
(45) Date of Patent: Jul. 21, 2020

(54) CURRENT SENSOR WITH POWER CALCULATION

(71) Applicant: Allegro MicroSystems, LLC, Manchester, NH (US)

(72) Inventors: Georges El Bacha, Manchester, NH (US); Evan Shorman, Manchester, NH (US); Cory Voisine, Manchester, NH (US); Alexander Latham, Harvard, MA (US); William P. Taylor, Amherst, NH (US)

(73) Assignee: Allegro Microsystems, LLC, Manchester, NH (US)

( * ) Notice: Subject to any disclaimer, the term of this patent is extended or adjusted under 35 U.S.C. 154(b) by 198 days.

(21) Appl. No.: 16/013,330

(22) Filed: Jun. 20, 2018

(65) Prior Publication Data
US 2019/0391185 A1 Dec. 26, 2019

(51) Int. Cl.
  *G01R 15/20* (2006.01)
  *G01R 19/00* (2006.01)
  *G01R 33/07* (2006.01)
  *G01R 33/09* (2006.01)

(52) U.S. Cl.
  CPC ......... *G01R 15/207* (2013.01); *G01R 15/202* (2013.01); *G01R 15/205* (2013.01); *G01R 19/0092* (2013.01); *G01R 33/07* (2013.01); *G01R 33/09* (2013.01)

(58) Field of Classification Search
  CPC ........ G01R 15/00; G01R 15/14; G01R 15/20; G01R 15/202; G01R 15/205; G01R 15/207; G01R 33/00; G01R 33/007; G01R 33/0082; G01R 33/02; G01R 33/06; G01R 33/07; G01R 33/09; G01R 19/00; G01R 19/0084; G01R 19/0092
  USPC ..... 324/76.11, 117 R, 117 H, 500, 512, 522, 324/600, 649, 691, 713
  See application file for complete search history.

(56) References Cited

U.S. PATENT DOCUMENTS

| | | | |
|---|---|---|---|
| 4,597,025 A * | 6/1986 | Rutchik | H01H 71/125 336/175 |
| 4,794,332 A * | 12/1988 | Schweitzer, Jr. | G01R 19/16509 324/133 |
| 7,075,287 B1 | 7/2006 | Mangtani et al. | |
| 7,476,816 B2 | 1/2009 | Doogue et al. | |
| 7,652,862 B2 * | 1/2010 | Martins | G06F 1/28 361/93.1 |
| 7,962,109 B1 * | 6/2011 | Stockstad | H03G 3/3047 455/115.1 |
| 8,907,437 B2 | 12/2014 | Milano et al. | |
| 9,410,990 B2 * | 8/2016 | Singh | G01R 15/20 |
| 9,411,025 B2 | 8/2016 | David et al. | |
| 9,494,660 B2 | 11/2016 | David et al. | |
| 9,500,716 B2 * | 11/2016 | Turner | G01R 31/40 |
| 9,529,024 B2 * | 12/2016 | Oshima | G01R 21/1331 |

(Continued)

*Primary Examiner* — Hoai-An D. Nguyen
(74) *Attorney, Agent, or Firm* — Daly, Crowley, Mofford & Durkee, LLP

(57) ABSTRACT

A current sensor integrated circuit including a magnetic field sensing element, a current conductor, an insulation structure, and a power calculation circuit is configured to meet safety isolation requirements. Isolation resistors allow for voltage from a high voltage side to be sensed at a low voltage side of the circuit. The insulation structure, current sensor package, and isolation resistors can achieve at least 500 Vrms isolation.

29 Claims, 5 Drawing Sheets

(56) References Cited

U.S. PATENT DOCUMENTS

| | | | |
|---|---|---|---|
| 9,666,788 B2 | 5/2017 | Taylor et al. | |
| 9,812,588 B2 | 11/2017 | Vig et al. | |
| 9,933,506 B2* | 4/2018 | Jost | G01R 33/09 |
| 2002/0145416 A1* | 10/2002 | Attarian | G01R 15/183 |
| | | | 324/127 |
| 2011/0219255 A1* | 9/2011 | Hsieh | G06F 1/26 |
| | | | 713/340 |
| 2012/0319676 A1* | 12/2012 | El-Essawy | G01R 33/0283 |
| | | | 324/126 |
| 2013/0116955 A1* | 5/2013 | Williams | G01R 15/20 |
| | | | 702/64 |
| 2013/0249544 A1 | 9/2013 | Vig et al. | |
| 2013/0265041 A1* | 10/2013 | Friedrich | G01R 15/207 |
| | | | 324/260 |
| 2015/0185797 A1* | 7/2015 | Cooper | G06F 1/28 |
| | | | 713/340 |
| 2016/0069935 A1* | 3/2016 | Kreikebaum | G01R 15/202 |
| | | | 324/117 H |
| 2016/0079845 A1* | 3/2016 | Kamiya | H02M 1/12 |
| | | | 318/400.3 |
| 2016/0377663 A1* | 12/2016 | Towne | G01R 33/02 |
| | | | 324/764.01 |
| 2018/0131174 A1* | 5/2018 | Kinsel | H01H 9/54 |
| 2018/0359542 A1* | 12/2018 | Jang | H04Q 9/00 |
| 2019/0229640 A1* | 7/2019 | Aichriedler | H02P 27/06 |

* cited by examiner

CURRENT SENSOR WITH POWER CALCULATION

STATEMENT REGARDING FEDERALLY SPONSORED RESEARCH

Not applicable.

FIELD

This disclosure relates generally to integrated circuit (IC) current sensors that contain magnetic field sensing elements and current conductors, and more particularly, to safety isolation approaches for such current sensors.

BACKGROUND

Safety isolation is an important consideration in the design of any electrical product that can expose users to potentially hazardous voltage levels. Manufacturers of such products need to ensure that their products are designed to adequately safe-guard against electrical shock.

In any safety isolation scheme, there is a certain amount of insulation required to create a protective isolation barrier between primary and secondary circuits. A primary circuit is a circuit that is directly connected to a line voltage and therefore has the potential to reach hazardous voltage levels. A secondary circuit is not electrically connected to the primary circuit (that is, there is no conductive connection between the secondary circuit and primary circuit) but could experience hazardous voltage levels if the insulation fails.

Underwriters Laboratories Inc. (UL) has developed a safety standard called UL 60950-1 (second edition), which specifies a high level of safety isolation to protect against risk of injury due to electric shock. The UL 60950-1 standard is based on the International Electrotechnical Commission (IEC) standard, IEC 60950-1 (second edition). The UL 60950-1 standard defines five categories of insulation: functional insulation; basic insulation; supplemental insulation; double insulation; and reinforced insulation. Functional insulation does not protect against electrical shock. Basic insulation is a single level of insulation that provides basic protection against electric shock. Supplemental insulation is independent insulation that can be applied in addition to basic insulation to reduce the risk of electrical shock in the event of a failure of the basic insulation. Double insulation comprises both basic insulation and supplemental insulation. Thus, basic insulation provides a single layer of insulating barrier between primary and secondary circuits, whereas double insulation provides two layers of insulating barrier between primary and secondary circuits. Reinforced insulation is a single insulation system that provides electrical shock protection equivalent to double insulation.

If a secondary circuit is not user-accessible, a basic level of isolation protection, that is, basic insulation, may be acceptable. Safety needs for products that include user accessible secondary circuits, on the other hand, demand two levels of protection provided by double insulation or its equivalent in reinforced insulation.

Integrated current sensors are known in the art. Illustrative current sensors of this type are sold under part numbers ACS712 and ACS722 by Allegro MicroSystems, LLC of Manchester, N.H., the Assignee of the subject application. These types of current sensors use a magnetic field transducer in proximity to a current conductor. The magnetic field transducer generates a signal having a magnitude proportional to the magnetic field induced by a current that flows through the current conductor.

Some current sensors may have the ability to provide reinforced isolation, or double isolation, as described in U.S. Pat. No. 8,907,437 entitled "Reinforced Isolation For Current Sensor With Magnetic Field Transducer" which Patent issued on Dec. 9, 2014 and which is assigned to the Assignee of the present application, the contents and teachings of which are hereby incorporated by reference in their entirety.

SUMMARY

The present disclosure provides an isolated current sensor including a lead frame having a first portion of current leads connected to form a primary current conductor to carry a primary current and a second portion of leads to form signal leads and a die coupled to the second portion of the lead frame by an interconnect. The die is configured to support a magnetic field signal generator configured to generate a magnetic field signal indicative of a level of the primary current, a power calculation circuit responsive to a first signal indicative of a level of the primary current and a second signal indicative of a voltage level associated with the primary conductor to generate a power signal indicative of a power level associated with the primary current conductor. An insulation structure is disposed between the primary current conductor and the die and a package body encloses the die, the interconnect and at least a portion of the lead frame.

In some embodiments, the magnetic field signal generator includes a magnetic field transducer such as a Hall effect element, a magnetoresistance (MR) element, or groups of such elements. MR elements may include, semiconductor magnetoresistance elements, giant magnetoresistance elements (GMR), tunneling magnetoresistance elements (TMR), anisotropic magnetoresistance elements (AMR), magnetic tunnel junctions (MTJ) or other MR element types. In some instances, a bridge circuit, or half-bridge circuit of magnetoresistance elements may be used. Multiple Hall effect or MR elements may be used in various series or parallel combinations.

One example provides a plastic mold material as the package body of the current sensor IC. The plastic surrounds the die and at least a portion of the lead frame. The signal leads and a portion of the primary current leads extend beyond or through the molded plastic material.

Another example uses a metal, and glass and/or ceramic hermetic package to enclose the die and a portion of the primary current conductor.

In some examples, the die may be coupled to the signal leads or second lead frame portion by interconnects such as wire bonds, solder balls or solder bumps, or stud bumps.

In one version, the insulation structure extends beyond the primary current conductor.

In one embodiment, the insulation structure is a reinforced isolation. This structure has at least two layers of isolation material. The insulation may be a Kapton® tape, polyimide tape, polyimide, or other organic coating on the die or lead frame, or inorganic materials such as nitride, oxide, and alumina. Combinations of insulation materials may also be used. In examples of polyimide tape, or Kapton® tape the polyimide or Kapton® layer has a thickness of at least 20 microns. The polyimide tape or Kapton® tape consists of a layer of adhesive and polyimide or Kapton®.

Another example embodiment has two insulation layers of polyimide tape between the die and the primary conductor. The two layers of tape may extend beyond the primary conductor by at least 0.4 mm.

In one example the distance from the primary current conductor and any of the signal leads or second lead frame portion is at least 0.4 mm. In some examples the minimum path around the insulation structure from the die to the primary current conductor, or first conductor portion of the lead frame is at least 0.4 mm.

In one example the first and second insulation layers provide a minimum working voltage of at least about 500 Vrms.

The current sensor has a voltage input signal lead and in some versions more than one voltage input signal lead. In some examples, the voltage input lead is connected to an isolation resistor. One end of the isolation resistor is connected to a voltage input lead and the other end of the isolation resistor is connected to a voltage which may be at a second potential, such as but not limited to the primary current conductor. In some cases multiple isolation resistors are placed in series between the voltage potential to be measured and the voltage input lead. In some versions, the isolation resistors are at least 1 MΩ. In some embodiments, two isolation resistors are included inside the package body of the current sensing integrated circuit.

In some instances, the current sensor integrated circuit has an output generating circuit. The output generating circuit generates an output signal in response to a current signal and/or a power output signal. In some cases, the output signal is provided at a signal lead of the integrated current sensor package.

Also described is a method implemented in a current sensor including electrically isolating a primary current conductor from a low voltage side of the current sensor, receiving a voltage signal indicative of a voltage across associated with the primary conductor, receiving a current signal indicative of a current through the primary conductor, and calculating a power level by a combination of the voltage signal and the current signal.

BRIEF DESCRIPTION OF THE DRAWINGS

The foregoing features of the disclosure, as well as the disclosure itself may be more fully understood from the following detailed description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the concepts, systems and techniques described herein. Like numbers in the figures denote like elements.

DETAILED DESCRIPTION

Figure 1:
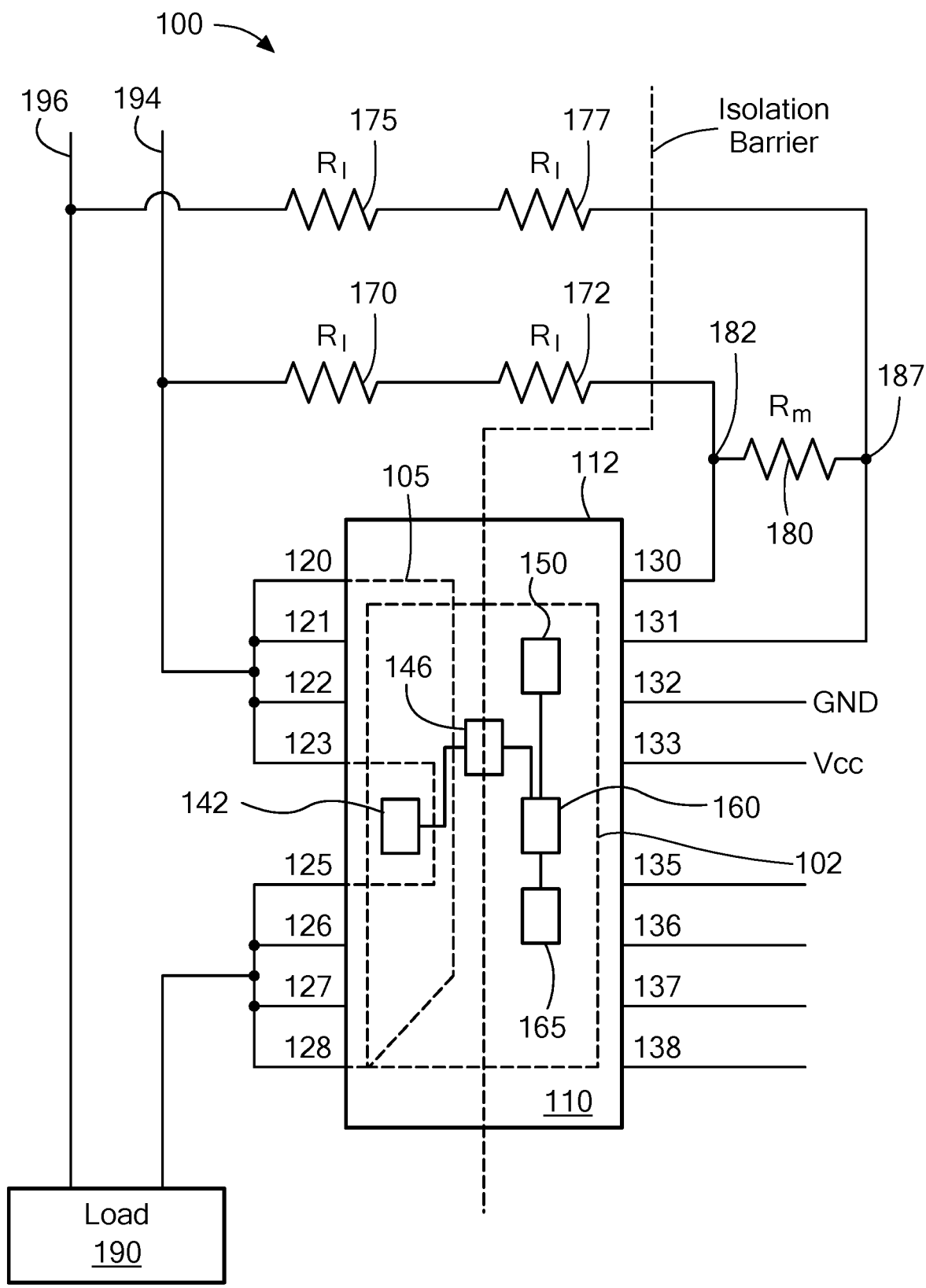
FIG. 1 shows schematic representation of an integrated current sensor having a power calculation circuit and reinforced isolation coupled to a load.

Referring to FIG. 1, a current sensor circuit 100 includes a current sensor integrated circuit (IC) 110 containing a package body 112, a die 102 (shown in dotted lines inside the package body 112), and a primary current conductor 105 (shown in dotted lines inside the package body 112). The current sensor circuit 100 further includes isolation resistors ($R_i$) 170, 172, 175, 177, a measurement resistor ($R_m$) 180, a load 190, and power inputs 194, 196. Load 190 is coupled between the power connections 194, 196 and receives current from the power connections 194 and 196. The die 102 may be configured to support a magnetic field generator 142, a current level circuit 146, a voltage level circuit 150, a power calculation circuit 160, and an output generating circuit 165. Current sensor circuit 100 may be constructed on a printed circuit (PC) board, a hybrid integrated circuit module, or other suitable means for connecting the load 190 and the current sensor IC 110.

In operation of current sensor circuit 100, the current sensor IC 110 is coupled in series with one of the power inputs 194 to measure the current supplied by the power input to the load 190. A current to be measured flows in the primary current conductor 105 and generates a magnetic field proportional to the current. The magnetic field is sensed by one or more magnetic field sensing elements of the magnetic field generator 142. As will be described further below in connection with FIG. 2, the magnetic field generator 142 is coupled to a current level circuit 146 which generates a current level signal, a first signal, which represents the level of the primary current in the primary current conductor 105. A voltage measurement circuit 150 provides a voltage signal, a second signal, representative of the voltage at input leads 130, 131. The voltage level circuit 150 and current level circuit 146 are coupled to a power calculation circuit 160 which generates a power signal coupled to an output generating circuit 165. The current level signal may be provided at an output of the current sensor IC 110 in the form of a voltage indicative of the level of the primary current.

The voltage levels on the primary current conductor 105 are isolated by the isolation resistors 170, 172, 175, 177 to prevent the high voltage on the high voltage side, primary side, or load side, of the circuit 100 from being transferred to the low voltage side of the circuit. The voltage levels as measured on the measurement resistor 180 may be combined with the current level in the primary current conductor 105 to provide a power output of the current sensor IC 110.

The current sensor IC 110, described in more detail in connection with FIGS. 2-5 includes a lead frame having a first portion including input current leads 120, 121, 122, 123 and output current leads 125, 126, 127, 128 coupled to form primary current conductor 105 and a second portion including signal leads 130, 131, 132, 133, 135, 136, 137, 138 that are coupled to die 102. The primary current conductor 105 is on a high voltage side of the current sensor circuit 100. The current sensor IC die 102 and the second portion of the lead frame including signal leads 130, 131, 132, 133, 135, 136, 137, 138 are on a low voltage side of the current sensor circuit 100. The current sensor IC 110 insulation structure is configured to isolate from the primary current conductor 105 from the die 102. The insulation structure may be, but is not limited to an insulating tape such as a Kapton® tape, a polyimide tape, or a polyimide material or an oxide or nitride material on the die surface or combinations of these layers and materials. U.S. Pat. No. 8,907,437, entitled "Reinforced Isolation For Current Sensor With Magnetic Field Transducer" which Patent issued on Dec. 9, 2014 and which is assigned to Allegro MicroSystems, LLC, the Assignee of the present application, describes various insulation layers, the contents and teachings of which are hereby incorporated by reference in their entirety.

The package body 112 of current sensor IC 110 encloses die 102 and a portion of the primary current conductor 105 and may be a molded plastic material, or other materials such as a metal package with dielectric isolation, for example glass or alumina, between the metal package body 112 and the leads 120-123, 125-128, 130-133, 135-138. A metal package allows for a hermetic package. The die 102 and a portion of the lead frame are encapsulated in a plastic material. In one embodiment, the plastic material is an epoxy mold compound material.

Current sensor IC 110 has a positive input lead (or voltage 1 lead) 130, a negative input lead (or voltage 2 lead) 131, a ground pin 132, and a supply voltage (or VCC) pin 133, and four output pins 135, 136, 137, 138.

Isolation resistors 170, 172 are coupled between a first power connection 194 and the positive, or voltage 1, input lead 130. Isolation resistors 175, 177 are coupled between a second power connection 196 and the negative, or voltage 2, input lead 131. Voltages 194 and 196 are described as positive and negative respectively, but other voltages may also be used, including but not limited to two AC voltage levels, two positive, or two negative voltage levels. A voltage measurement resistor 180 is coupled on the low voltage side of the circuit between node 182 (between isolation resistor 172 and lead 130) and node 187 (between isolation resistor 177 and lead 131). The die 102 is configured to receive the voltage signals, or voltage levels at leads 130, 131 and connect them to a voltage level circuit 150. In one embodiment, to achieve reinforced isolation levels, the isolation resistors 170, 172, 175, 177 each have a resistance greater than or equal to 1 MΩ, which allows for a reinforced isolation rating of the current sensor circuit 100.

Figure 2:
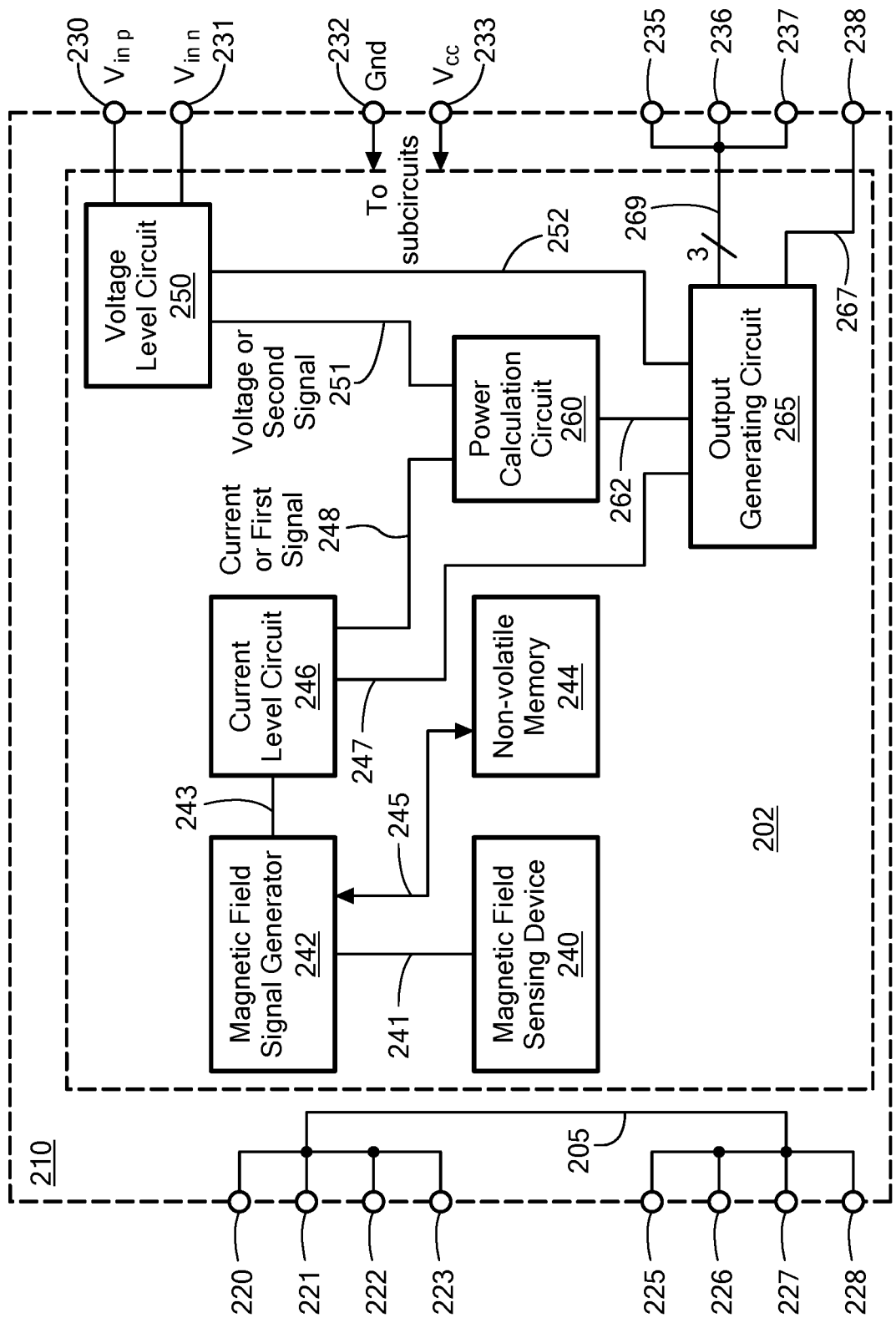
FIG. 2 is a block diagram of the power calculation integrated current sensor of FIG. 1.

Referring to FIG. 2 an integrated circuit current sensor 210, that may be the same as or similar to current sensor IC 110 of FIG. 1, includes input current leads 220, 221, 222, 223 that are coupled to output current leads 225, 226, 227, 228 to form the primary current conductor (or primary current path) 205. Signal leads 230, 231, 232, 233, 235, 236, 237, 238 are coupled to die 202 by an interconnect. A package body, not shown, could enclose the die 202, a portion of the primary current conductor 205, and a portion of the signal leads 230, 231, 232, 233, 235, 236, 237, 238.

A magnetic field sensing device 240 on die 202 is positioned near the primary current conductor 205. The magnetic field sensing device 240 contains at least one magnetic field sensing element. The magnetic field sensing element may be, but is not limited to a Hall effect element, a magnetoresistance element, including but not limited to a magnetoresistance (MR) element, an anisotropic magnetoresistance (AMR) element, a giant magnetoresistance (GMR) element, a tunneling magnetoresistance element (TMR), or a magnetic tunnel junction (MTJ) element, or other element for converting magnetic field into an electrical signal. In one embodiment, the magnetic field sensing device 240 contains multiple magnetic field sensing elements, including but not limited to multiple Hall effect elements, or a bridge of MR, for example GMR or TMR elements. The magnetic field sensing device 240 has an output 241 coupled to a magnetic field signal generating circuit 242 or may form part of the magnetic field signal generating circuit 242. The magnetic field signal generator 242 may include amplifiers, temperature compensation, ADCs, or other circuitry to generate a magnetic field signal 243 indicative of a current through the primary current conductor 205. Magnetic field signal 243 is coupled to a current level circuit 246. The techniques to generate the magnetic field signal 243 are well understood and the examples provided are not a complete list.

In an embodiment, a non-volatile memory element 244 or number of elements may be used to adjust the magnetic field signal 243 over temperature, or other factors. The magnetic field signal generator 242 may read and write data from and to the non-volatile memory 244 using signal line 245. Although signal line 245, or memory signal 245, is shown as one line, other numbers of memory signal connections could be used. The memory signal 245 is shown only connected to the magnetic field signal generator 242, but could be connected to other circuit elements on the die 202 as needed.

Current level circuit 246 generates a first signal or current level signal 248 which represents the primary current in the primary current conductor 205 and may be either an analog or digital signal. Thus, current level circuit 246, may include analog, digital, or a combination of analog and digital circuit elements.

Voltage input signal leads 230, 231 are coupled to receive voltages representing the voltage level of the power inputs coupled to the IC 210 (e.g., power inputs 194, 196 of FIG. 1). A voltage level circuit 250 generates a second signal or a voltage level signal 251, either analog or digital, which represents the measured voltage across leads 230, 231 (e.g., across measurement resistor 180 of FIG. 1). In another embodiment the voltage input signal leads 230, 231 may be connected to another voltage of interest for the power calculation.

The current level signal 248 and the voltage level signal 251 are both coupled to a power calculation circuit 260 that may be the same as or similar to power calculation circuit 160 of FIG. 1. The power calculation circuit 260 may be a multiplier circuit that multiplies the current signal 248 and the voltage signal 251 to generate a power signal 262. The multiplication may occur in either the digital or analog domains depending on the circuit design. Other circuits to generate a power signal 262 may also be used, including but not limited to threshold circuits, comparator circuits, or a microprocessor circuit. In one embodiment, the power calculation circuit 260 may output a binary signal to represent the power being above or below a limit.

An output generating circuit 265 that may be the same as or similar to output generating circuit 165 of FIG. 1 is coupled to receive power signal 262. Output signals 267, 269 are generated by the output generating circuit 265 which provides the output of the current sensor IC 210 at leads 235, 236, 237, 238. A power output signal may be one of the outputs generated by output generating circuit 265 and represent a power level in the load coupled to the current sensor (e.g., load 190 of FIG. 1).

In embodiments, a current signal 247 may be coupled to the output generating circuit 265 and the output generating circuit may provide a current output signal 267 indicative of a current level of the primary current through primary conductor 205 at a current output lead 238. Output generating circuit 265 may additionally or alternatively provide an overcurrent signal having a signal state indicating an overcurrent fault detection to at least one of the output pins 235-238. In another embodiment, a voltage level signal 252 generated by voltage level circuit 250 and indicative of a voltage associated with the primary conductor 205 is coupled to the output generating circuit 265. The output generating circuit 265 may generate an output signal on one or more of the output leads 235-238 representative of a voltage zero crossing state, where the primary voltage measurement changes signs or crosses zero for an AC voltage or the midpoint of a peak to peak voltage transition of the primary current conductor. Output leads 235, 236, 237 may be used to output a digital output signal or output according to a known protocol, including but not limited to I²C, SENT, SPI, or UART (also known as serial). In a SPI embodiment leads 235-238 may all be used for the SPI communication. Other embodiments may have more or fewer than 3 digital or analog output leads, for example 1 to 8 output leads.

An embodiment may have current signal 247 as an analog signal pass through the output generating circuit 265 as current output signal 267 to the output lead 238 with no further processing. Such an embodiment may be useful for fast current transient detection. In another embodiment, the current level signals 247 and 248 are of different types, for example signal 248 is a digital signal and signal 247 is an analog signal. In other embodiments, signals 247 and 248 may be the same type and one of the two signals may not be required for the current sensor IC 210 to operate as desired. An example may have the current level signal 247 coupled to the power calculation circuit 260 and the output generating circuit 265.

Figure 3:
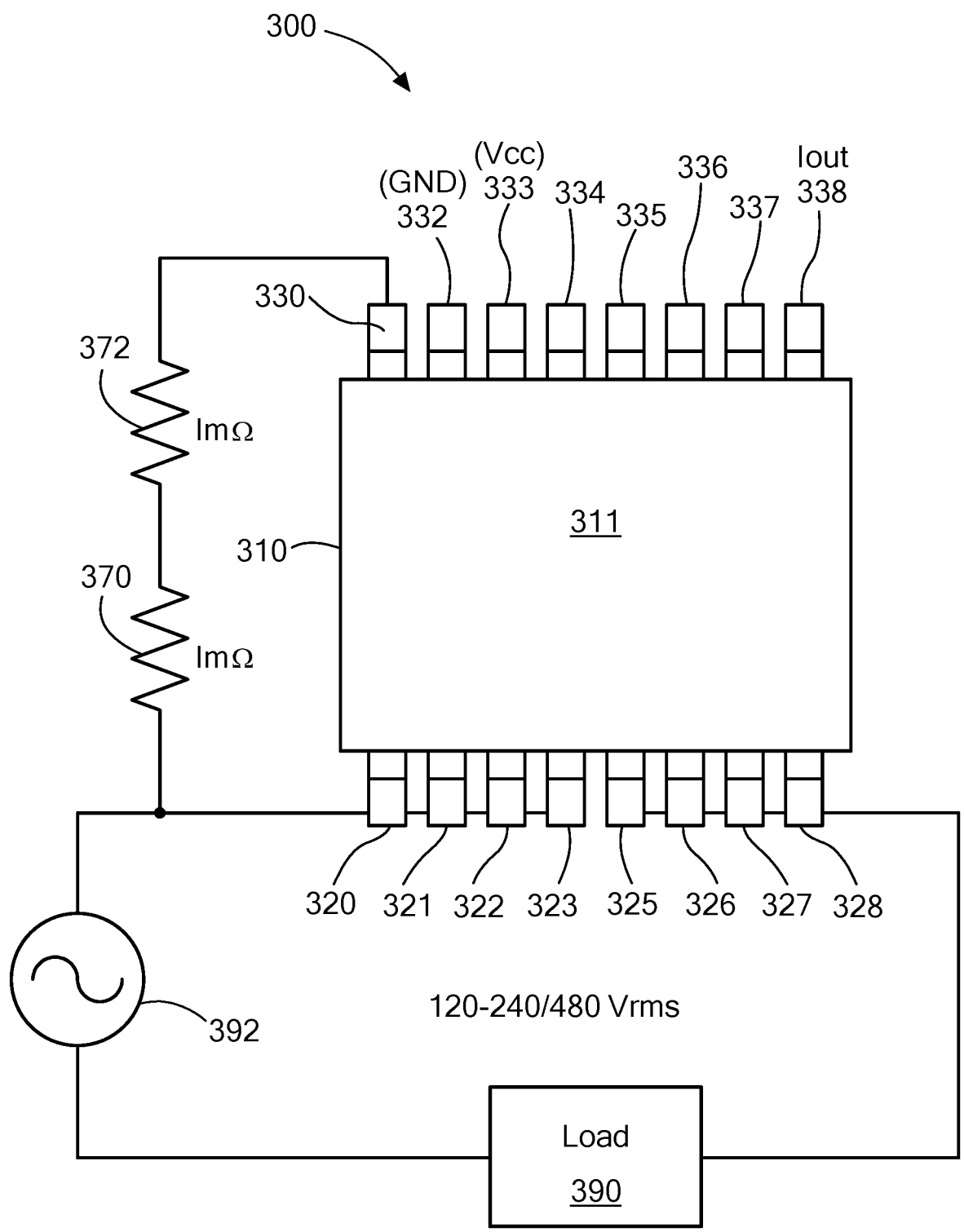
FIG. 3 shows a simplified power calculation integrated current sensor.

FIG. 3 shows current sensor circuit 300 including a current sensor IC 310. Current sensor IC 310 has a power input lead 330, which is isolated from the primary current by isolation resistors 370, 372. A power source is represented by 392, shown as an AC power source 392. The load 390 is connected from the one side of power source 392 to the output current leads 325, 326, 327, 328. The other side of the power source 392 is connected to one side of isolation resistor 370 and also the input current leads 320, 321, 322, 323 of the current sensor IC 310. Current sensor IC 310 has a ground lead 332; chip power input or supply voltage (VCC) lead 333; output leads 334, 335, 336, 337; and a current output lead 338. Current output lead 338 may be an analog output lead at which an analog signal indicative of a current level through the primary conductor is provided for use in connection with a fast current transient detection circuit as described above in reference to FIG. 2. In another embodiment the lead 338 may be a power output lead representing a power level associated with a load coupled to the current sensor.

Although five output pins are shown in FIG. 3 for the current sensor IC 310, other numbers of output leads would be possible with different package sizes. In some cases, the only output lead could be lead 338. In such an embodiment, the current sensor IC 310 may be an SOIC8 with less isolation than a wide-body SOIC 16 package type.

The die 102 and 202 described with respect to FIGS. 1 and 2 can be configured as, but are not limited to, die up or flip-chip assembly. As described below, FIGS. 4 and 5 illustrate versions of these two types of assemblies respectively.

Figure 4:
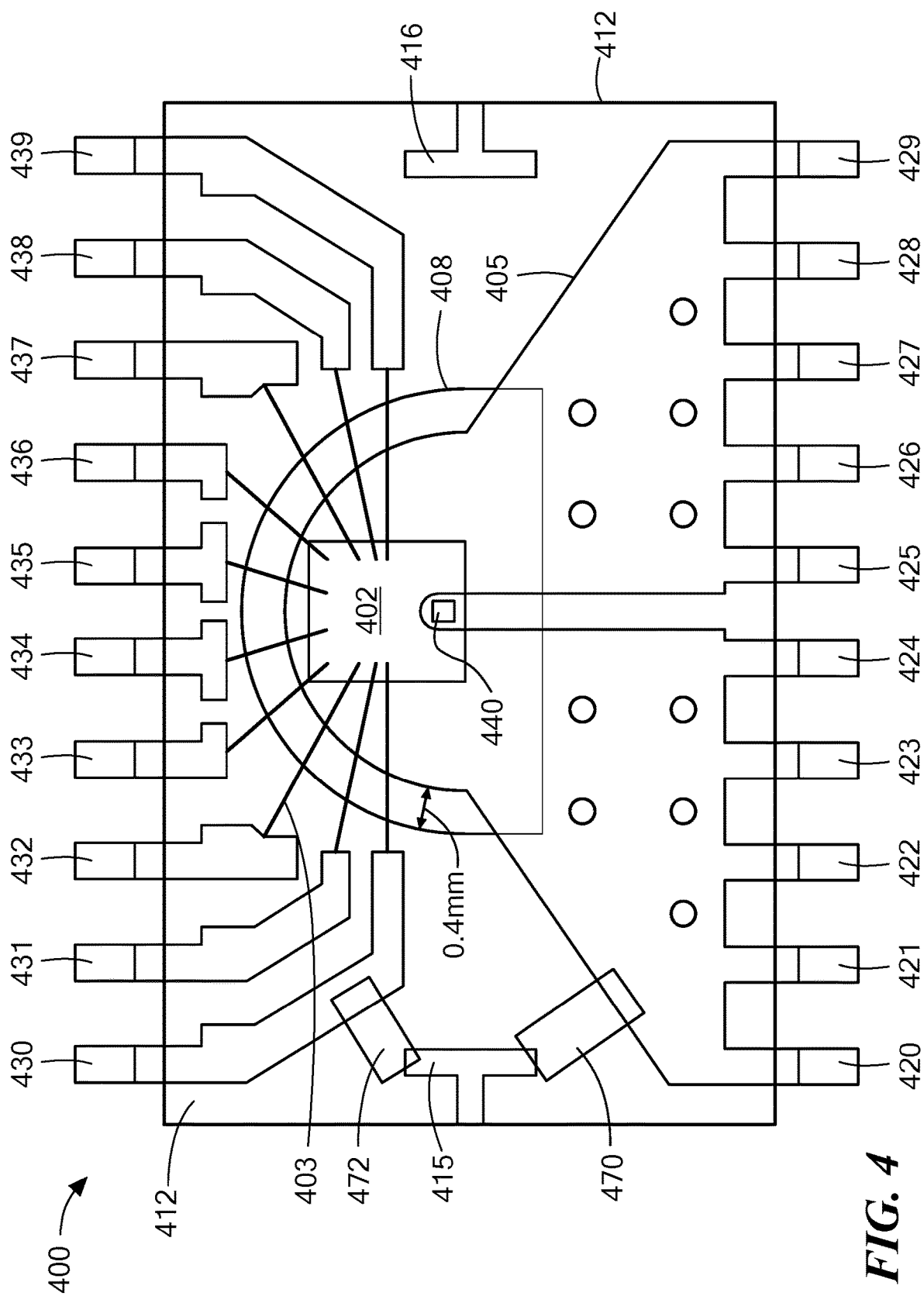
FIG. 4 shows an internal top-view with dimensions of a reinforced isolation power calculation integrated current sensor.
Figure 5:
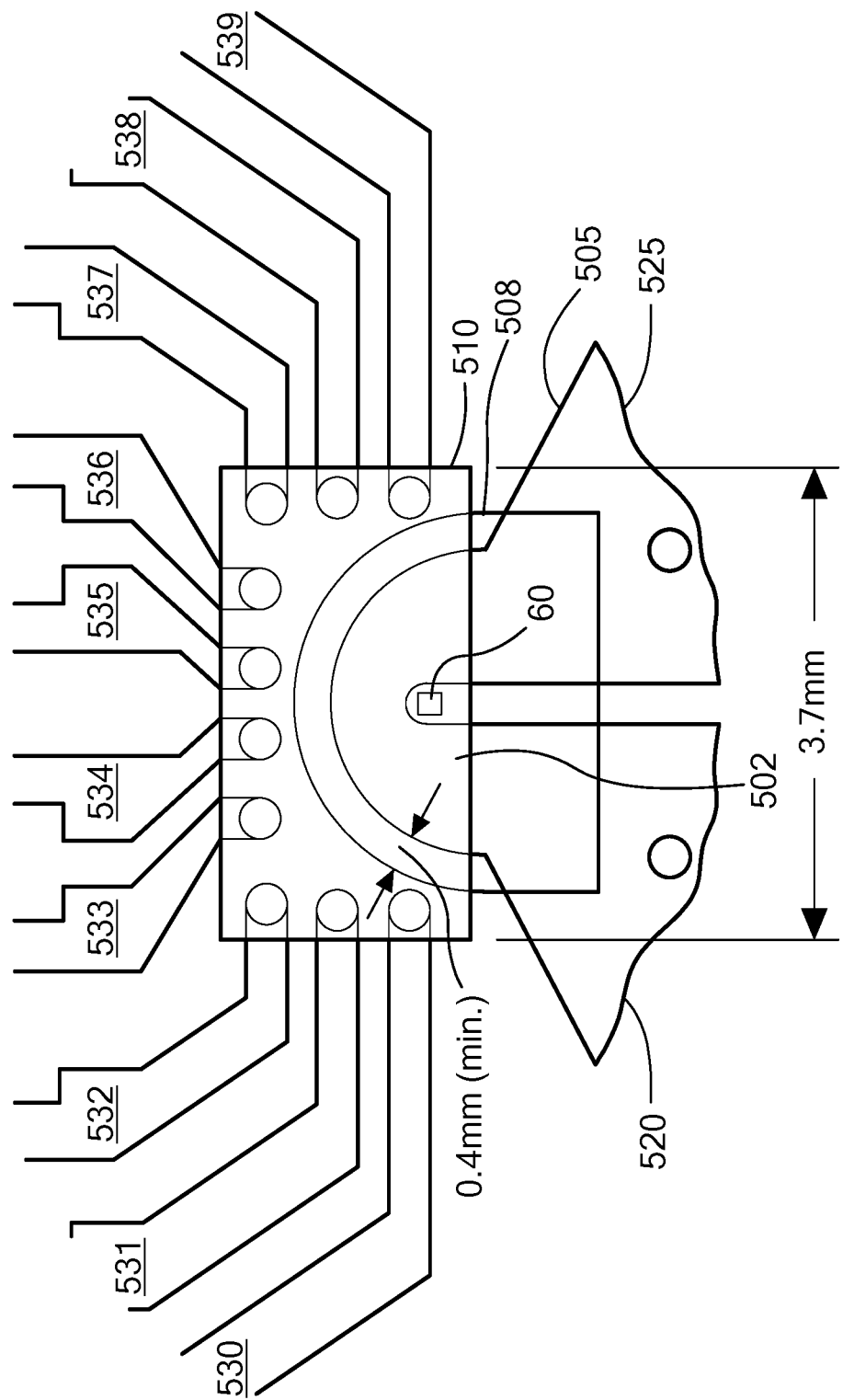
FIG. 5 shows a flip-chip stack-up of the primary conductor, insulating layers and a die.

FIG. 4 shows a current sensor 400 which may be the same as or similar to current sensor IC 110 or 210. Current sensor 400 includes current input leads 420-424, current output leads 425-429, signal leads 430-439, die 402, wire bonds 403, primary current path or primary conductor 405, and insulation structure or layer 408. In the embodiment of FIG. 4, the die 402 is placed in a "die up" configuration, or die up assembly, on top of the insulation layer 408 which is coupled to the primary current path 405 which forms part of the first portion of the lead frame. The die 402 is coupled to a second lead frame portion, including signal leads 430-439 by wire bonds, for example wire bond 403 between die 402 and lead 432. A magnetic field sensing device 440 can be positioned proximate to the primary conductor 405 as shown.

As illustrated, the primary current conductor 405 has a curved periphery portion and the insulation structure 408 has a substantially semicircular shape with a curved portion that extends laterally beyond the curved periphery portion of the primary current conductor 405 by an overhang dimension of a minimum of 0.4 mm including all tolerances. In an embodiment the insulation structure 408 extends beyond the current path 405 by at least 0.4 mm. In an embodiment, insulation structure 408 includes two layers of insulation which may be a tape, such as Kapton® tape. In some embodiments, a polyimide tape includes a polymer layer and an adhesive layer. In one embodiment, the polyimide tape insulation layer is at least 20 microns in thickness. In another embodiment, the insulation layer may be a dielectric interposer made of a ceramic material such as alumina, or a polymer material. Multiple layers of dielectric material may be used in a combination of the same or similar materials or different dielectric materials to meet the dielectric requirements of a particular application. Although FIG. 4 shows the insulation structure 408 as extending beyond the primary conductor 405 but not over the second lead frame portion including leads 430-439, one alternate embodiment could have the insulation structure over the leads 430-439 and the wire bond connections moved to a different portion of leads 430-439.

Another embodiment has isolation resistors 470, 472 that may be the same as or similar to resistors 370, 372 of FIG. 3 inside the package body 412. Isolation resistors 470, 472 may be at least 1 MΩ each. The isolation resistor 470 may be coupled between the primary current conductor 405 and a lead frame tab 415. Isolation resistor 472 may be coupled between the lead frame tab 415 and the lead 430, which may carry the voltage input signal to the IC die 402. Alternatively, rather than coupling resistors 470, 472 to lead frame tab 415 for example, a resistor network including at least two resistors can be coupled directly between primary current conductor 405 and lead 430. In an embodiment where two voltage inputs are needed, two additional isolation resistors (not shown) may be placed in series between the primary current conductor 405, a lead frame tab 416, and the lead 439 in similar placement to isolation resistors 470, 472 in relation to lead frame tab 415. In such an embodiment, lead 439 would be configured to be a voltage input lead. In order to achieve a reinforced isolation, the distances between the primary current conductor 405, the lead frame tabs 415, 416, and the leads 430, 439 can be at least 0.4 mm and the isolation resistors, for example 470, 472, can be at least 1 MΩ. A measurement resistor, similar to 180 of FIG. 1, could be provided inside the package body 412. In embodiments, a measurement resistor can be provided on the die 402 connected between input voltage nodes of interest, for example between leads 430, 439. Another embodiment would provide a measurement resistor, similar to 180 of FIG. 1, external to the package body 412 between leads 430 and 439 on, for example, the small signal side of the circuit board (not shown in FIG. 4).

FIG. 5 shows an isolated current sensor IC 510 that may be the same as or similar to current sensor IC 110, 210 where the secondary signal leads 530-539, or second lead frame portion, are attached to the die 502 using a flip-chip assembly technology, which may include but is not limited to mechanical and electrical connections with solder bumps, solder balls, or stud bumps. The die 502 is isolated from the primary current conductor 505 by isolation layer (isolation structure) 508. Primary current input leads to the package are not shown but would connect to the primary current path at 520 and 525 in FIG. 5. A magnetic field sensing device 60 can be positioned proximate to the primary conductor 505 as shown.

In an embodiment, the isolation layer 508 is a Kapton® tape material, or a polyimide tape material. For a reinforced isolation current sensor, a first insulation layer and a second insulation layer may be used to form insulation layer 508. The first insulation layer and the second insulation layer may be the same or different materials, for example, but not limited to two layers of polyimide tape. In one embodiment, the polyamide tape is a Kapton® tape. In an embodiment, the isolation layer 508 extends beyond the edge of the primary current path 505 by at least 0.4 mm. The use of the 0.4 mm clearance or distance beyond the primary along with two layers of polyimide tape of at least 25 microns in thickness can result in a working voltage rating, the rating of which active voltages are allowed between the high side voltage and low side voltage, of 500 Vrms. Other working voltages, either higher or lower, are possible with different mechanical and material constructions. In one embodiment, three layers of tape may be used. Larger extension or distance than 0.4 mm of the isolation layer beyond the primary current conductor or high voltage side of the package can be used to increase the working voltage.

Having described preferred embodiments which serve to illustrate various concepts, systems circuits, packages and techniques, which are the subject of this patent, it will now become apparent to those of ordinary skill in the art that other embodiments incorporating these concepts, systems circuits, packages and techniques may be used. For example, it should be noted that individual concepts, features (or elements) and techniques of different embodiments described herein may be combined to form other embodiments not specifically set forth above. Furthermore, various concepts, features (or elements) and techniques, which are described in the context of a single embodiment, may also be provided separately or in any suitable sub-combination. It is thus expected that other embodiments not specifically described herein are also within the scope of the following claims.

In addition, it is intended that the scope of the present claims include all other foreseeable equivalents to the elements and structures as described herein and with reference to the drawing figures. Accordingly, the subject matter sought to be protected herein is to be limited only by the scope of the claims and their equivalents. It is felt, therefore that the concepts, systems, circuits and techniques described herein should not be limited by the above description, but only as defined by the spirit and scope of the following claims which encompass, within their scope, all such changes and modifications.

All publications and references cited herein are expressly incorporated herein by reference in their entirety.

What is claimed is:

1. A current sensor comprising:
    a lead frame having a first portion comprising current leads connected to form a primary current conductor to carry a primary current and a second portion comprising signal leads;
    a die coupled to the second portion of the lead frame by an interconnect and configured to support:
        a magnetic field signal generator configured to generate a magnetic field signal indicative of a level of the primary current; and
        a power calculation circuit responsive to a first signal indicative of a level of the primary current and a second signal indicative of a voltage level associated with the primary conductor to generate a power signal indicative of a power level associated with the primary current conductor, wherein the signal leads comprise a voltage input signal lead and wherein the second signal is associated with a voltage level at the voltage input signal lead;
    a package body enclosing the die and a portion of the primary current conductor;
    an insulation structure disposed between the primary current conductor and the die; and
    at least two isolation resistors coupled in series between the primary current conductor and the voltage input signal lead.

2. The current sensor of claim 1, wherein said package body is a molded package body comprising a molded plastic material enclosing the die, the interconnect and at least a portion of the lead frame.

3. The current sensor of claim 1, wherein the insulation structure covers at least a portion of the primary current conductor and extends beyond a periphery of the primary current conductor.

4. The current sensor of claim 1, wherein the coupling of the die to the second lead frame portion by the interconnect comprises a flip-chip assembly.

5. The current sensor of claim 1, wherein the insulation structure comprises a first insulation layer and a second insulation layer.

6. The current sensor of claim 1, wherein the die is further configured to support an output generating circuit.

7. The current sensor of claim 6, wherein the output generating circuit is configured to generate a current output signal in response to a current signal and a power output signal in response to a power signal.

8. The current sensor of claim 7, wherein the current output signal is provided at at least one of the signal leads and the power output signal is provided at least one of the other signal leads.

9. The current sensor of claim 1, wherein the coupling of the die to the second lead frame portion by the interconnect comprises a die-up assembly, wherein the interconnect comprises wire bonds.

10. The current sensor of claim 1, wherein each of the at least two isolation resistors has a resistance of at least 1 MΩ.

11. The current sensor of claim 1, wherein the at least two isolation resistors are enclosed by the package body.

12. The current sensor of claim 1, wherein the magnetic field signal generator comprises a magnetic field transducer having a sensing element selected from one of a Hall effect sensing element or a magnetoresistive sensing element.

13. The current sensor of claim 3, wherein a distance between the primary current conductor and any one of the signal leads is at least 0.4 mm.

14. The current sensor of claim 13, wherein a path around the insulation structure from the die to the first portion of the lead frame is at least 0.4 mm in distance.

15. The current sensor of claim 5, wherein the first and second insulation layers each have a thickness sufficient to meet a minimum working voltage rating of 500 VRMS.

16. The current sensor of claim 2, wherein the signal leads extend through the molded plastic material.

17. The current sensor of claim 3, wherein the primary current conductor has a curved periphery portion and the insulation structure has a substantially semicircular shape with a curved portion that extends laterally beyond the curved periphery portion of the primary current conductor by an overhang dimension of a minimum of 0.4 mm including all tolerances.

18. The current sensor of claim 5, wherein the first and second insulation layers each comprises a tape that includes a polyimide film layer and an adhesive layer.

19. The current sensor of claim 18, wherein the polyimide film layer has a thickness of at least 20 microns.

20. In a current sensor having a primary current conductor, a method comprising:
 electrically isolating the primary current conductor from a low voltage side of the current sensor by providing a reinforced isolation between a high voltage side of the current sensor to which the primary current conductor is coupled and the low voltage side of the current sensor, wherein providing the reinforced isolation comprises providing at least two isolation resistors between the primary current conductor and the low voltage side of the current sensor;
 receiving a voltage signal indicative of a voltage associated with the primary current conductor;
 receiving a current signal indicative of a current through the primary conductor; and
 calculating a power level by a combination of the voltage signal and the current signal.

21. The method of claim 20, further comprising generating an output signal indicative of a voltage zero crossing state.

22. The method of claim 20, further comprising generating a digital output signal.

23. The method of claim 22, wherein generating the digital output signal comprises generating the output signal in at least one of a SENT, SPI, UART, or I$^2$C format.

24. The method of claim 20, further comprising receiving a digital input signal at at least one signal lead associated with the low voltage side of the current sensor.

25. The method of claim 20, wherein providing at least two isolation resistors comprises providing at least two resistors each with a resistance of at least 1 MΩ.

26. The method of claim 20, wherein providing at least two isolation resistors comprises providing at least two isolation resistors inside a package body of the current sensor.

27. The method of claim 20, further comprising generating an output signal indicative of the current level through the primary current conductor.

28. The method of claim 20, further comprising generating an output signal indicative of the power level.

29. The method of claim 20, further comprising generating an output signal indicative of an overcurrent state.

* * * * *